United States Patent
Chen

(10) Patent No.: US 8,593,805 B2
(45) Date of Patent: Nov. 26, 2013

(54) PORTABLE ELECTRONIC DEVICE AND THERMAL MODULE THEREOF

(75) Inventor: Rung-An Chen, Taipei Hsien (TW)

(73) Assignee: Foxconn Technology Co., Ltd., New Taipei (TW)

(*) Notice: Subject to any disclaimer, the term of this patent is extended or adjusted under 35 U.S.C. 154(b) by 391 days.

(21) Appl. No.: 12/981,550

(22) Filed: Dec. 30, 2010

(65) Prior Publication Data

US 2012/0075804 A1 Mar. 29, 2012

(30) Foreign Application Priority Data

Sep. 24, 2010 (TW) .................................. 99132322

(51) Int. Cl.
| | |
|---|---|
| H05K 7/20 | (2006.01) |
| G06F 1/20 | (2006.01) |
| F28F 7/00 | (2006.01) |
| H01L 23/34 | (2006.01) |
| H01L 23/427 | (2006.01) |
| H01L 23/473 | (2006.01) |
| F28D 15/02 | (2006.01) |

(52) U.S. Cl.
CPC .......... *G06F 1/203* (2013.01); *G06F 2200/201* (2013.01); *H01L 23/427* (2013.01); *H01L 23/473* (2013.01); *F28D 15/0266* (2013.01)
USPC ...... 361/679.47; 361/697; 361/700; 361/703; 361/719; 165/80.5; 165/104.33; 257/715; 174/15.2; 415/126; 415/213.1

(58) Field of Classification Search
USPC ....................... 361/679.46–679.54, 688–723; 165/80.1–80.5, 104.33, 185; 257/712–722, E23.088; 174/15.1–15.2, 174/16.1–16.3, 252

See application file for complete search history.

(56) References Cited

U.S. PATENT DOCUMENTS

| | | | | |
|---|---|---|---|---|
| 6,442,025 | B2* | 8/2002 | Nakamura et al. ............ | 361/695 |
| 7,057,897 | B2* | 6/2006 | Leu ............................... | 361/704 |
| 7,123,484 | B2* | 10/2006 | Tsai .............................. | 361/719 |
| 7,474,526 | B2* | 1/2009 | Fujiwara ................... | 361/679.52 |
| 7,489,510 | B1* | 2/2009 | Hung et al. ................... | 361/700 |
| 7,667,961 | B2* | 2/2010 | Fujiwara ................... | 361/679.47 |
| 7,903,402 | B2* | 3/2011 | Tomioka et al. .......... | 361/679.47 |
| 8,107,239 | B2* | 1/2012 | Fujiwara ....................... | 361/695 |
| 8,125,783 | B2* | 2/2012 | Tanaka ......................... | 361/720 |
| 8,270,165 | B2* | 9/2012 | Kaneko ........................ | 361/700 |
| 2009/0009967 | A1* | 1/2009 | Nishizawa et al. ........... | 361/695 |

* cited by examiner

*Primary Examiner* — Zachary M Pape
(74) *Attorney, Agent, or Firm* — Wei Te Chung; Ming Chieh Chang

(57) ABSTRACT

A thermal module includes a centrifugal fan and a circuit board. The circuit board defines a through hole therein. The centrifugal fan includes a top plate located above the circuit board and aligned with the through hole, a first sidewall extending from a circumferential edge of the top plate toward the circuit board, a bottom plate located below the circuit board and aligned with the through hole, a second sidewall extending from a circumferential edge of the bottom plate toward the circuit board, and an impeller. The first sidewall abuts a top surface of the circuit board around the through hole. The second sidewall abuts a bottom surface of the circuit board around the through hole. The impeller is smaller than the through hole. The impeller extends through to be located in the through hole.

20 Claims, 3 Drawing Sheets

PORTABLE ELECTRONIC DEVICE AND THERMAL MODULE THEREOF

This application claims all benefits accruing under 35 U.S.C. §119 from Taiwanese Patent Application No. 99132322, filed on Sep. 24, 2010, in the Taiwan Intellectual Property Office, the contents of which are hereby incorporated by reference.

BACKGROUND

1. Technical Field

The present disclosure relates to portable electronic devices, and more particularly to a thermal module for a portable electronic device.

2. Description of Related Arts

Thermal modules are widely used in portable electronic devices for dissipating heat therefrom. Typically, a portable electronic device such as a notebook computer includes an enclosure, a circuit board received in the enclosure, an electronic component mounted on a top surface of the circuit board, and a thermal module for dissipating heat from the electronic component. A mounting space is defined between an inner surface of the enclosure and the top surface of the circuit board in which the thermal module is mounted on. The thermal module includes a heat sink for dissipating heat from the heat generating component, and a cooling fan generating airflow across the heat sink to accelerate heat dissipation.

However, with continued efforts toward miniaturization, the mounting space has been continually reduced. Accordingly, the height of the cooling fan and the heat sink are reduced, which limits airflow and heat dissipation area of the heat sink, with accordingly, heat efficiency of the thermal module diminished.

What is needed, therefore, is an improved thermal module for use in a portable electronic device which can overcome the limitations described.

DETAILED DESCRIPTION

Figure 1:
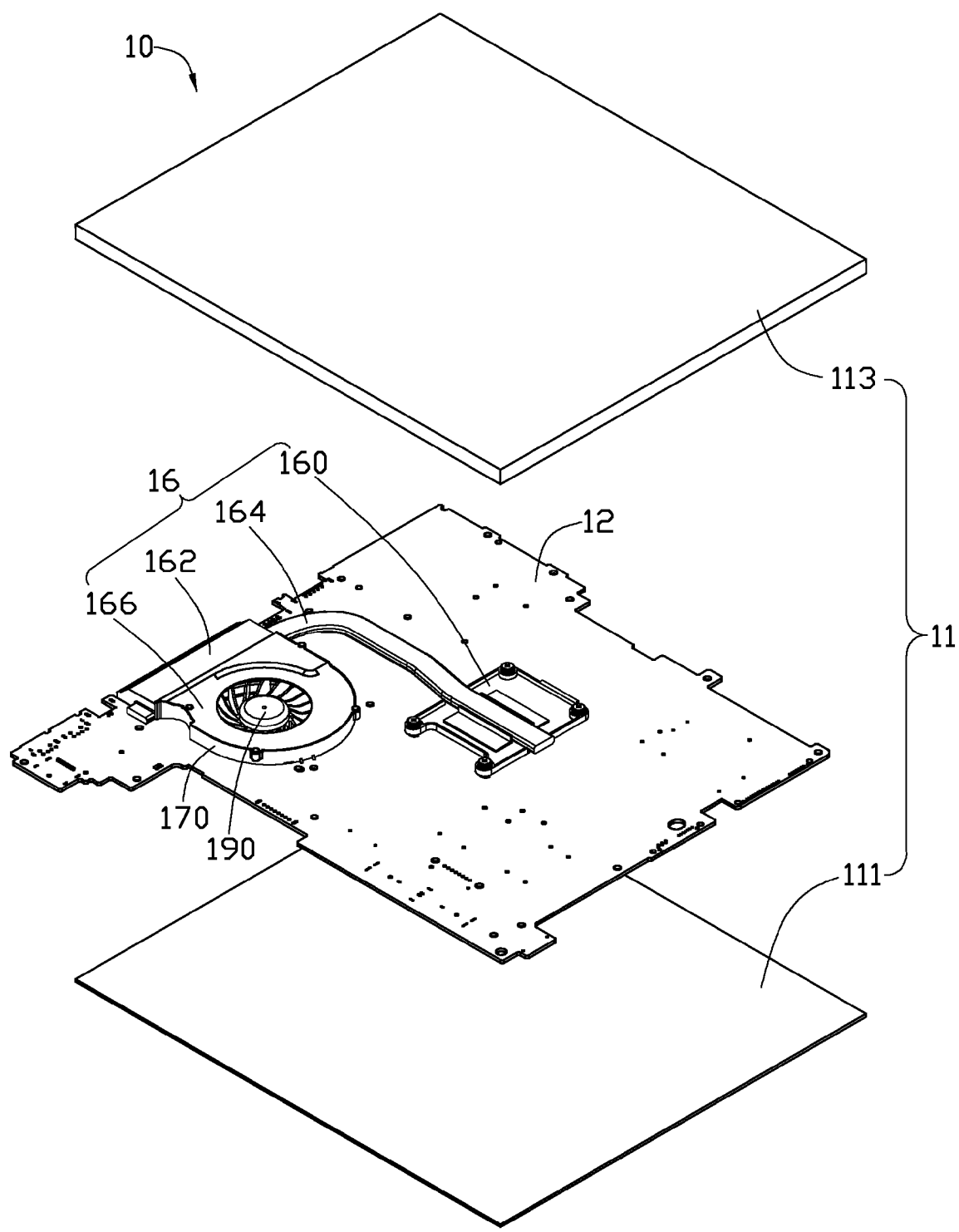
FIG. 1 is an exploded, isometric view of a portable electronic device in accordance with an embodiment of the disclosure.
Figure 2:
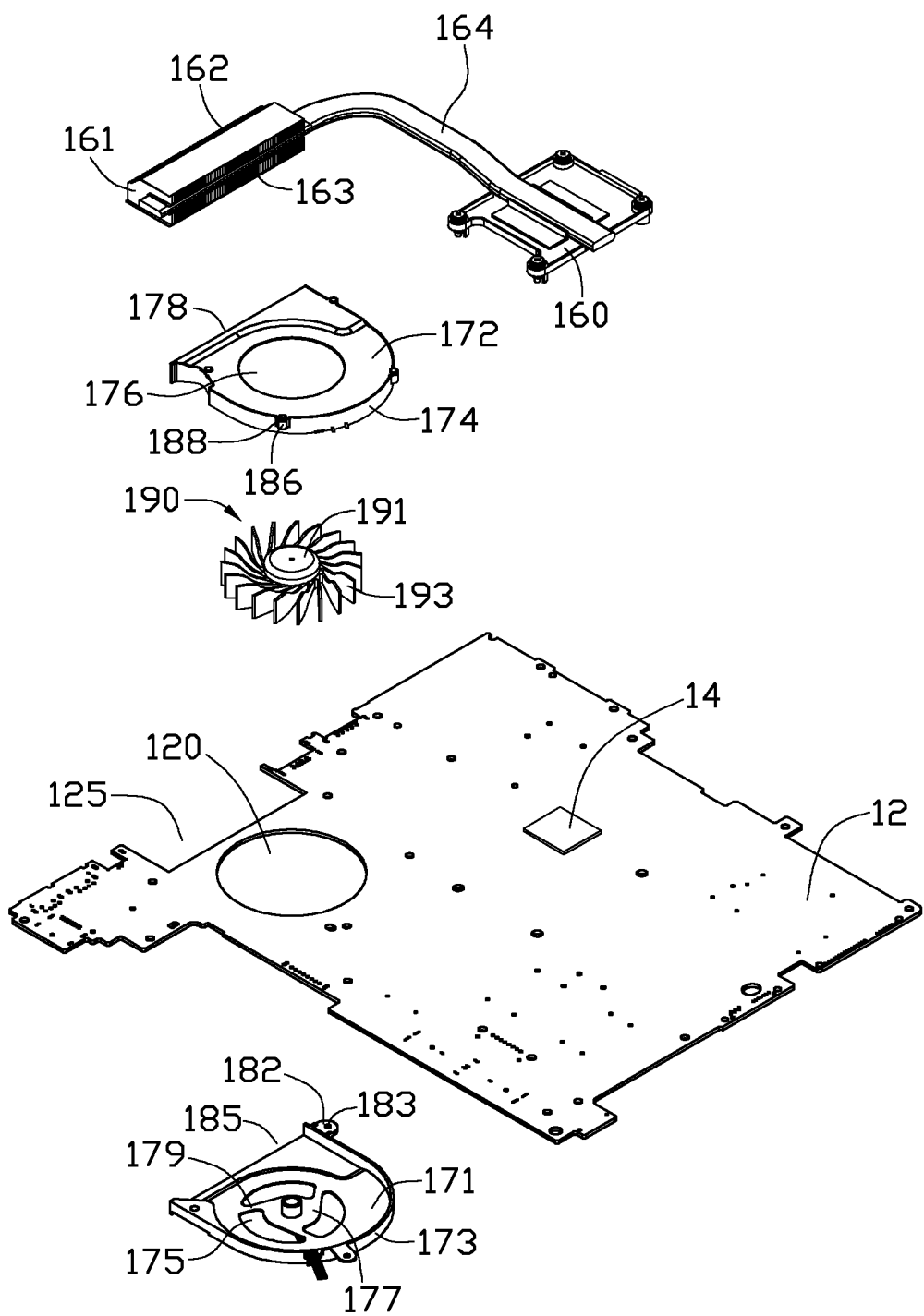
FIG. 2 is an exploded view of the portable electronic device of FIG. 1, with an enclosure of the portable electronic device omitted.
Figure 3:
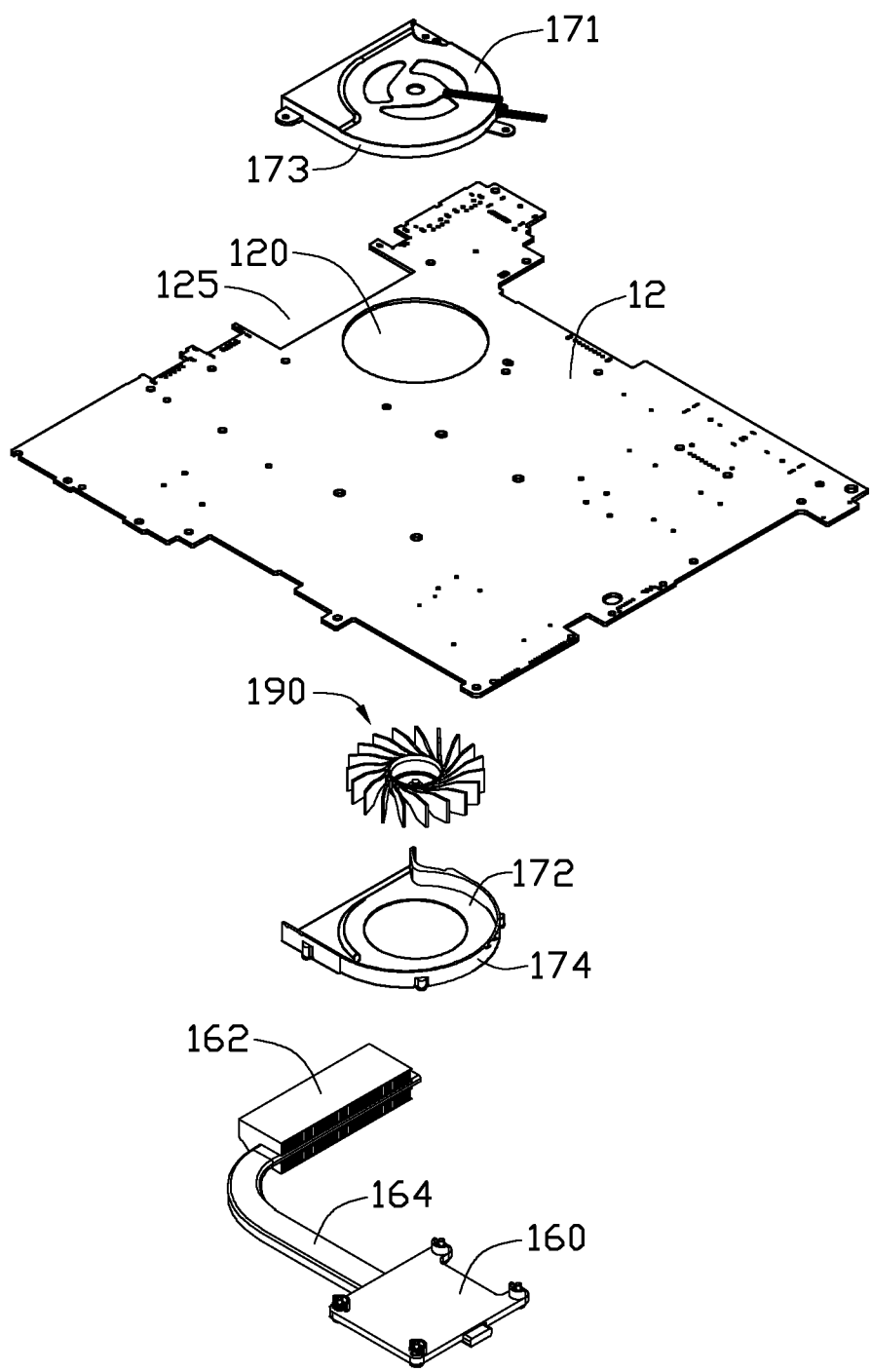
FIG. 3 is an inverted view of the portable electronic device of FIG. 2.

Referring to FIGS. 1-3, a portable electronic device 10 in accordance with an embodiment of the disclosure is shown. The portable electronic device 10 includes an enclosure 11, a circuit board 12 received in the enclosure 11, and a thermal module 16 attached to the circuit board 12. In the illustrated embodiment, the portable electronic device 10 is a notebook computer, with a display of the notebook computer omitted for clarity.

The enclosure 11 includes a bottom plate 111 and a top cover 113 to cover the bottom plate 111. When the portable electronic device 10 is assembled, the bottom plate 111 and the top cover 113 cooperatively define a receiving space therein for the circuit board 12 and the thermal module 16. The circuit board 12 is spaced from both the inner surface of the top cover 113 and the inner surface of the bottom plate 111.

The circuit board 12 defines a circular through hole 120 adjacent to a corner thereof, and defines a rectangular cutout 125 at a lateral side thereof, wherein the cutout 125 is disposed adjacent to the through hole 120. The cutout 125 extends inwardly from a side edge of the circuit board 12, and thus the cutout 125 is substantially U-shaped. The cutout 125 is spaced from the through hole 120. An electronic component 14, such as a central processing unit (CPU), is mounted on a top surface of the circuit board 12. The electronic component 14 is located away from the through hole 120 of the circuit board 12.

The thermal module 16 includes a heat absorbing plate 160, a centrifugal fan 166, a fin assembly 162 attached to one side of the centrifugal fan 166, and a heat pipe 164 thermally connecting the heat absorbing plate 160 to the fin assembly 162. The heat absorbing plate 160 is thermally attached to the electronic component 14 to absorb heat therefrom. The fin assembly 162 includes a plurality of fins 161 stacked together. The fin assembly 162 defines a receiving groove 163 on the axis along which the fins 161 are stacked. The receiving groove 163 is substantially U-shaped in cross section. The heat pipe 164 is flat and substantially L-shaped and includes an evaporating section thermally connected with the heat absorbing plate 160 and a condensing section received in the receiving groove 163 of the fin assembly 162.

The fin assembly 162 of the thermal module 16 is located at the cutout 125 of the circuit board 12. An upper portion of the fin assembly 162 is located above a top surface of the circuit board 12, and a lower portion of the fin assembly 162 is located below a bottom surface of the circuit board 12.

The centrifugal fan 166 includes a casing 170 and an impeller 190 received therein. The casing 170 includes a top plate 172 above the through hole 120 of the circuit board 12, a first sidewall 174 extending downwardly from a circumferential portion of the top plate 172 towards the circuit board 12, a bottom plate 171 located below the through hole 120 of the circuit board 12, and a second sidewall 173 extending upwardly from a circumferential portion of the bottom plate 171 towards the circuit board 12. The bottom plate 171 is of a shape and size substantially the same as the top plate 172, and the bottom plate 171 is aligned with the top plate 172. The through hole 120 is smaller than both the top plate 172 and the bottom plate 171.

The top plate 172 and the first sidewall 174 are located above the circuit board 12. The top plate 172 is aligned with the through hole 120 of the circuit board 12, and a bottom of the first sidewall 174 abuts against the top surface of the circuit board 12 around the through hole 120. The bottom plate 171 and the second sidewall 173 are located below the circuit board 12. The bottom plate 171 is aligned with the through hole 120 of the circuit board 12, and a top of the second sidewall 173 abuts against a bottom surface of the circuit board 12 around the through hole 120. The first sidewall 174 and the second sidewall 173 are aligned with each other, thus sandwiching the circuit board 12 therebetween. The through hole 120 of the circuit board 12 is substantially located at a center of the casing 170.

The top plate 172 defines a first air inlet 176 aligned with the through hole 120 of the circuit board 12. The bottom plate 171 defines a second air inlet 175 aligned with the through hole 120 of the circuit board 12. The second air inlet 175 equals the first air inlet 176 in size. The through hole 120 is larger than both the first air inlet 176 and the second air inlet 175. The first sidewall 174 defines a first air outlet 178 corresponding to the upper portion of the fin assembly 162. The second sidewall 173 defines a second air outlet 185 corresponding to the lower portion of the fin assembly 162. A total size of the first air outlet 178 and the second air outlet 185 is the same as the fin assembly 162. The upper portion of the fin assembly 162 matches the first air outlet 178. The lower portion of the fin assembly 162 matches the second air outlet 185.

A plurality of mounting portions 186 are formed at an outer periphery of the first sidewall 174. Each mounting portion 186 defines a mounting hole 188 along an axis of the centrifugal fan 166. A fastener (not shown) such as a screw can be provided to extend through the mounting hole 188 of the mounting portion 186 and be received in the circuit board 12, to fix the first sidewall 174 to the circuit board 12. The second sidewall 173 forms a plurality of fixing portions 182 to connect with the circuit board 12. Each fixing portion 182 is in the form of a tab. Each fixing portion 182 extends outward from the top of the second sidewall 173. Each fixing portion 182 defines a fixing hole 183 along the axis of the centrifugal fan 166. Fasteners (not shown) such as screws can be provided to extend through the fixing holes 183 of the fixing portions 182 and be received in the circuit board 12, to fix the second sidewall 173 to the circuit board 12.

A supporting base 177 is located at a center of the second air inlet 175 of the bottom plate 171 for mounting a stator (not shown) thereon. The supporting base 177 is connected with the bottom plate 171 by a plurality of ribs 179. The impeller 190 includes a hub 191 and a plurality of blades 193 extending radially and outwardly from the hub 191. The impeller 193 is rotatably mounted to the stator. The impeller 190 has an outer diameter slightly less than that of the through hole 120, and thus the impeller 190 extends through and is located in the through hole 120. An upper portion of the impeller 190 is located above the top surface of the circuit board 12, and a lower portion of the impeller 190 is located below the bottom surface of the circuit board 12.

The location of a lower portion of the centrifugal fan 166 and the lower portion of the fin assembly 162 below the circuit board 12 fully utilizes space below the circuit board 12, allowing the centrifugal fan 166 and the fin assembly to remain a large size despite the smaller mounting space in the portable electronic device 10.

In operation, the heat absorbing plate 160 absorbs heat from the heat generating component 14. The heat pipe 164 transfers the heat from the heat absorbing plate 160 to the fin assembly 162. The impeller 190 of the centrifugal fan 166 rotates, generating airflow to the fin assembly 162 via the first air outlet 178 and the second air outlet 185, thereby evacuating hot air from the fin assembly 162.

It is to be understood, however, that even though numerous characteristics and advantages of certain embodiment(s) have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A thermal module comprising:
a circuit board defining a through hole;
a centrifugal fan comprising a casing and an impeller received in the casing, wherein the impeller is smaller than the through hole, and extends through to be located in the through hole, the casing comprising:
a top plate located above the circuit board and aligned with the through hole, and the top plate defining a first air inlet aligned with the through hole of the circuit board;
a first sidewall extending from a circumferential edge of the top plate toward the circuit board and abutting a top surface of the circuit board around the through hole;
a bottom plate located below the circuit board and aligned with the through hole, the bottom plate defining a second air inlet aligned with the through hole of the circuit board, and the second air inlet equaling the first air inlet in size; and
a second sidewall extending from a circumferential edge of the bottom plate toward the circuit board and abutting a bottom surface of the circuit board around the through hole; and
a fin assembly located adjacent to the centrifugal fan, the centrifugal fan generating airflow to the fin assembly, the first sidewall of the centrifugal fan defining a first air outlet oriented toward and matching an upper portion of the fin assembly, the second sidewall of the centrifugal fan defining a second air outlet oriented toward and matching a lower portion of the fin assembly, and a total size of the first air outlet and the second air outlet being the same as a size of the fin assembly.

2. The thermal module of claim 1, wherein the through hole of the circuit board is substantially circular.

3. The thermal module of claim 1, wherein an upper portion of the impeller is located above the top surface of the circuit board, and a lower portion of the impeller is located below the bottom surface of the circuit board.

4. The thermal module of claim 1, wherein the first sidewall comprises a plurality of mounting portions, and each mounting portion defines a mounting hole therein through which a fastener extends and is received in the circuit board, to fix the first sidewall to the circuit board.

5. The thermal module of claim 1, wherein the second sidewall comprises a plurality of fixing portions, and each fixing portion defines a fixing hole therein for allowing a fastener to extend through and engage with the circuit board, to fix the second sidewall to the circuit board.

6. The thermal module of claim 1, further comprising a heat absorbing plate thermally contacting an electronic component on the circuit board, and a heat pipe thermally connecting the heat absorbing plate to the fin assembly.

7. The thermal module of claim 6, wherein the circuit board defines a cutout adjacent to the through hole, and the fin assembly is located at the cutout of the circuit board.

8. The thermal module of claim 7, wherein the upper portion of the fin assembly is located above the top surface of the circuit board, the lower portion of the fin assembly is located below the bottom surface of the circuit board.

9. The thermal module of claim 7, wherein the cutout extends inwardly from a side edge of the circuit board towards the through hole.

10. A portable electronic device, comprising:
an enclosure defining a receiving space therein;
a circuit board received in the enclosure, the circuit board defining a through hole;
an electronic component mounted on the circuit board; and
a thermal module for dissipating heat from the electronic component, the thermal module comprising a centrifugal fan and a fin assembly adjacent to the centrifugal fan, the centrifugal fan generating airflow to the fin assembly, the centrifugal fan comprising a casing and an impeller received in the casing, the impeller having a size smaller than the through hole, the impeller extending through and located in the through hole, the casing comprising an upper portion and a lower portion, the upper portion being located above the circuit board and abutting the circuit board around the through hole, the lower portion being located below the circuit board and abutting the circuit board around the through hole, and the circuit board being sandwiched between the upper portion and the lower portion of the centrifugal fan, the upper portion of the casing comprising a top plate and a first sidewall extending from a circumferential edge of the top plate toward the circuit board, the top plate defining a first air inlet aligned with the through hole of the circuit board, the lower portion of the casing comprising a bottom plate and a second sidewall extending from a circumferential edge of the bottom plate toward the circuit board, the bottom plate defining a second air inlet aligned with the through hole of the circuit board, the second air inlet equaling the first air inlet in size, the first sidewall of the centrifugal fan defining a first air outlet oriented toward and matching an upper portion of the fin assembly, the second sidewall of the centrifugal fan defining a second air outlet oriented toward and matching a lower portion of the fin assembly, a total size of the first air outlet and the second air outlet being the same as a size of the fin assembly.

11. The portable electronic device of claim 10, wherein the through hole of the circuit board is substantially circular.

12. The portable electronic device of claim 10, wherein a bottom of the first sidewall abuts a top surface of the circuit board.

13. The portable electronic device of claim 12, wherein a top of the second sidewall abuts a bottom surface of the circuit board.

14. The portable electronic device of claim 13, wherein an upper portion of the impeller is located above the top surface of the circuit board, and a lower portion of the impeller is located below the bottom surface of the circuit board.

15. The portable electronic device of claim 13, wherein the first sidewall comprises a plurality of mounting portions, and each mounting portion defines a mounting hole therein through which a fastener extends and engages with the circuit board, to fix the first sidewall to the circuit board.

16. The portable electronic device of claim 13, wherein the second sidewall comprises a plurality of fixing portions, and each fixing portion defines a fixing hole therein for allowing a fastener to extend through and engage with the circuit board, to fix the second sidewall to the circuit board.

17. The portable electronic device of claim 13, further comprising a heat absorbing plate thermally contacting the heat generating component, and a heat pipe thermally connecting the heat absorbing plate to the fin assembly.

18. The portable electronic device of claim 17, wherein the circuit board defines a cutout adjacent to the through hole, and the fin assembly is located at the cutout of the circuit board.

19. The portable electronic device of claim 18, wherein the upper portion of the fin assembly is located above the top surface of the circuit board, the lower portion of the fin assembly is located below the bottom surface of the circuit board.

20. The portable electronic device of claim 18, wherein the cutout extends inwardly from a side edge of the circuit board towards the through hole.

\* \* \* \* \*